(12) United States Patent
Arimatsu

(10) Patent No.: US 8,994,253 B2
(45) Date of Patent: Mar. 31, 2015

(54) PIEZOELECTRIC VIBRATING PIECE, PIEZOELECTRIC VIBRATOR, OSCILLATOR, ELECTRONIC DEVICE, AND RADIO-CONTROLLED TIMEPIECE

(71) Applicant: Seiko Instruments Inc., Chiba (JP)

(72) Inventor: Daishi Arimatsu, Chiba (JP)

(73) Assignee: SII Crystal Technology Inc., Chiba (JP)

( * ) Notice: Subject to any disclaimer, the term of this patent is extended or adjusted under 35 U.S.C. 154(b) by 177 days.

(21) Appl. No.: 13/759,235

(22) Filed: Feb. 5, 2013

(65) Prior Publication Data
US 2013/0208573 A1    Aug. 15, 2013

(30) Foreign Application Priority Data
Feb. 13, 2012 (JP) ................................. 2012-028732

(51) Int. Cl.
| | |
|---|---|
| H01L 41/09 | (2006.01) |
| H03H 9/21 | (2006.01) |
| H01L 41/107 | (2006.01) |
| G04C 9/00 | (2006.01) |
| H03B 5/32 | (2006.01) |
| H03H 9/10 | (2006.01) |

(52) U.S. Cl.
CPC ............... H01L 41/107 (2013.01); G04C 9/02 (2013.01); H03B 5/32 (2013.01); H03H 9/1021 (2013.01); H03H 9/21 (2013.01)
USPC ........................................................ 310/370

(58) Field of Classification Search
CPC ... H03H 9/21; H03H 9/215; H03H 2003/026; G01C 19/56; B06B 1/0659
USPC ................. 310/370; 333/200; 331/156
See application file for complete search history.

(56) References Cited

U.S. PATENT DOCUMENTS

| | | | |
|---|---|---|---|
| 7,176,604 B2 * | 2/2007 | Nakatani | 310/370 |
| 8,053,958 B2 * | 11/2011 | Kikushima | 310/370 |
| 8,283,988 B2 * | 10/2012 | Yamada et al. | 331/154 |
| D678,835 S  * | 3/2013 | Sakamoto | D13/101 |
| 8,497,620 B2 * | 7/2013 | Kikushima | 310/370 |
| 8,552,624 B2 * | 10/2013 | Yamada et al. | 310/370 |
| 8,593,039 B2 * | 11/2013 | Yamada et al. | 310/370 |
| 8,598,770 B2 * | 12/2013 | Yamada et al. | 310/370 |
| 8,633,638 B2 * | 1/2014 | Kikushima | 310/370 |
| 2007/0240511 A1 * | 10/2007 | Higuchi et al. | 73/514.34 |
| 2013/0221808 A1 * | 8/2013 | Morimoto et al. | 310/366 |

FOREIGN PATENT DOCUMENTS

| | | |
|---|---|---|
| JP | 2002-261558 | 9/2002 |
| JP | 2010178064 A  * | 8/2010 |

* cited by examiner

*Primary Examiner* — J. San Martin
(74) *Attorney, Agent, or Firm* — Brinks Gilson & Lione

(57) ABSTRACT

Provided are a piezoelectric vibrating piece, a piezoelectric vibrator, an oscillator, an electronic device, and a radio-controlled timepiece which can effectively suppress the vibration leakage while maintaining sufficient rigidity of the piezoelectric vibrating piece without making the piezoelectric vibrating piece large-sized. A chamfered portion is formed on corner portions of a connecting portion 21 on a narrow width portion side on both sides in the widthwise direction (Y direction). Due to such chamfered portions, a cross-sectional area (width size) of the connecting portion is gradually reduced toward the narrow width portion from a distal end side (vibrating arm portion side). The chamfered portion may be formed such that an angle θ with respect to side surfaces on both sides of the connecting portion becomes 60° (θ=60°).

9 Claims, 10 Drawing Sheets

US 8,994,253 B2

PIEZOELECTRIC VIBRATING PIECE, PIEZOELECTRIC VIBRATOR, OSCILLATOR, ELECTRONIC DEVICE, AND RADIO-CONTROLLED TIMEPIECE

RELATED APPLICATIONS

This application claims priority under 35 U.S.C. §119 to Japanese Patent Application No. 2012-028732 filed on Feb. 13, 2012, the entire content of which is hereby incorporated by reference.

BACKGROUND OF THE INVENTION

1. Field of the Invention

The present invention relates to a piezoelectric vibrating piece, a piezoelectric vibrator, an oscillator, an electronic device, and a radio-controlled timepiece.

2. Description of the Related Art

For example, in a mobile phone and a personal digital assistant, it is often the case that a piezoelectric vibrator which makes use of crystal or the like is used as a time source, a timing source for control signals, a reference signal source or the like. As this kind of piezoelectric vibrator, there has been known a piezoelectric vibrator where a tuning-fork-type piezoelectric vibrating piece is hermetically sealed in a package where a cavity is formed.

The package has the structure where a pair of glass substrates (ceramic substrates also being used) in which a recessed portion is formed on one of the glass substrates is overlapped to each other and is directly bonded to each other thus providing the structure where the recessed portion functions as a cavity. Further, the piezoelectric vibrating piece includes a pair of vibrating arm portions which is arranged parallel to each other, and a base portion to which longitudinal proximal end sides of both vibrating arm portions are integrally fixed. Both vibrating arm portions of the piezoelectric vibrating piece vibrate (swing) in the direction that the vibrating arm portions approach each other or are separated from each other with predetermined resonance frequency using proximal end sides thereof as starting points.

Recently, as represented by a mobile phone or the like, the miniaturization of various electronic devices each of which incorporates a piezoelectric vibrator therein has been in progress. Accordingly, there has been a demand for further miniaturization with respect to a piezoelectric vibrating piece which constitutes the piezoelectric vibrator. In view of such circumstances, studies have been made to shorten a total length of the piezoelectric vibrating piece by shortening a base portion of the piezoelectric vibrating piece, for example.

However, in mounting the piezoelectric vibrating piece, the piezoelectric vibrating piece is mounted by way of a base portion and hence, when a length of the base portion is shortened, there arises a drawback that a mounting performance is deteriorated. Accordingly, the length of the base portion is usually designed to be as short as possible within a range where the mounting performance can be ensured.

It has been also known that the vibration leakage (leakage of vibration energy) is generated via a base portion of a piezoelectric vibrating piece when the piezoelectric vibrating piece is operated. This vibration leakage is linked with the rise of a CI value (Crystal Impedance) and hence, it is necessary to suppress the vibration leakage as much as possible. In this respect, the vibrations of a vibrating arm portion can be stabilized by setting a length of the base portion as large as possible so that the vibration leakage can be efficiently suppressed. However, as described above, from a viewpoint of miniaturization, the length of the base portion is designed to be as short as possible within a range where the mounting performance can be ensured and hence, there has been a demand for the constitution which can suppress the vibration leakage without changing the length of the base portion.

In view of the above, JP-A-2002-261558 (patent literature 1) discloses the constitution where cutaway portions (notches) which are formed by cutting a base portion toward the center in the widthwise direction from both sides of the base portion are formed between the connecting portion of the base portion where the base portion is connected to the vibrating arm portion and the mount portion thus forming a portion of the base portion where the cutaway portions are formed as a narrow width portion where a width is narrow compared to other portions of the base portion.

Due to such a constitution, the vibrations excited by a vibrating arm portion can be confined in a vibrating arm portion side whereby the leakage of vibrations toward the base portion side can be suppressed.

SUMMARY OF THE INVENTION

In the constitution disclosed in patent literature 1, it is considered that the deeper the cutaway portion, that is, the narrower a width of the narrow width portion, the narrower a route through which the vibrations of the vibrating arm portion propagates to the base portion becomes and hence, the vibrations can be easily confined in a vibrating arm portion side whereby a vibration leakage suppression effect can be enhanced.

However, there exists a drawback that the narrower the narrow width portion, the rigidity of the piezoelectric vibrating piece against the external impact or the like is lowered. On the other hand, when a width of the narrow width portion is increased, the above-mentioned sufficient vibration leakage suppression effect cannot be acquired.

It may be also considered that the cutaway portions are formed largely along the longitudinal direction of the vibrating arm portions. In this case, however, the piezoelectric vibrating piece becomes large-sized.

The present invention has been made in view of the above-mentioned drawbacks, and it is an object of the present invention to provide a piezoelectric vibrating piece, a piezoelectric vibrator, an oscillator, an electronic device, and a radio-controlled timepiece which can effectively suppress the vibration leakage while maintaining sufficient rigidity of the piezoelectric vibrating piece without making the piezoelectric vibrating piece large-sized.

The present invention adopts the following means to overcome the above-mentioned drawbacks.

That is, according to a first aspect of the present invention, there is provided a piezoelectric vibrating piece which includes: a pair of vibrating arm portions which is arranged parallel to each other; and a base portion to which a proximal end side of the pair of vibrating arm portions in a longitudinal direction are integrally fixed, wherein the base portion includes: a connecting portion to which the proximal end side of the vibrating arm portion is fixed; a mount portion for mounting the base portion; and a narrow width portion which is positioned between the connecting portion and the mount portion, and has a length thereof in a widthwise direction orthogonal to the longitudinal direction set smaller than a length of the connecting portion and a length of the mount portion in the widthwise direction due to a pair of cutaway portions which is formed by cutting away the base portion inwardly from both outer sides respectively, wherein a width reducing portion whose length in the widthwise direction is gradually reduced toward the narrow width portion is formed on the connecting portion.

In this manner, by forming the width reducing portion whose length in the widthwise direction is gradually reduced toward the narrow width portion on the connecting portion, a route through which vibrations excited by the vibrating arm portion propagates in the mount portion can be narrowed whereby the vibrations are confined in a vibrating arm portion side thus suppressing leakage of vibrations to a mount portion side. Accordingly, the vibration leakage can be effectively suppressed and hence, the rise of a CI value can be suppressed whereby the degradation of quality of an output signal can be suppressed.

The piezoelectric vibrating piece having the above-mentioned constitution is also characterized in that a corner chamfered portion is formed as the width reducing portion on a corner portion of the connecting portion in the widthwise direction on a narrow width portion side.

In forming the width reducing portion by the corner chamfered portion, it is preferable to set a corner chamfered angle of the corner chamfered portion with respect to the longitudinal direction to 60°. By forming the chamfered portion at such an angle, in forming an outer shape of a piezoelectric vibrating piece by etching a piezoelectric plate, an etching residue attributed to a crystal azimuth of a piezoelectric material is hardly produced so that a tapered shape of the chamfered portion can be formed with high accuracy. As a result, it is possible to suppress irregularities in a vibration leakage characteristic of the piezoelectric vibrating piece.

Assuming a widthwise size of a portion where the corner chamfered portion is formed as NC and a widthwise size of the cutaway portion as NW, it is preferable that the relationship of NC≥0.5×NW is established. When this relationship is satisfied, a vibration leakage suppression effect can be further enhanced.

It is another aspect of the present invention to provide a piezoelectric vibrator which is characterized in that the piezoelectric vibrating piece according to the present invention is hermetically sealed in a package.

In this case, the piezoelectric vibrator includes the piezoelectric vibrating piece according to the present invention and hence, it is possible to provide a high-quality and highly-reliable piezoelectric vibrator which can effectively suppress the vibration leakage while realizing the miniaturization of the piezoelectric vibrator and maintaining sufficient rigidity of the piezoelectric vibrator.

It is another aspect of the present invention to provide an oscillator which is characterized in that the piezoelectric vibrator according to the present invention is electrically connected to an integrated circuit as an oscillator element.

It is still another aspect of the present invention to provide an electronic device which is characterized in that the piezoelectric vibrator according to the present invention is electrically connected to a timer part.

It is still another aspect of the present invention to provide a radio-controlled timepiece which is characterized in that the piezoelectric vibrator according to the present invention is electrically connected to a filter part.

The above-mentioned constitutions respectively include the above-mentioned piezoelectric vibrator of the present invention and hence, it is possible to provide a high-quality and highly-reliable oscillator, electronic device, and radio-controlled timepiece which can prevent these devices from becoming large-sized while maintaining sufficient rigidity of the piezoelectric vibrator.

According to the piezoelectric vibrating piece of the present invention, the vibration leakage can be effectively suppressed while preventing the piezoelectric vibrating piece from becoming large-sized and maintaining sufficient rigidity of the piezoelectric vibrating piece.

Further, the piezoelectric vibrator of the present invention includes the piezoelectric vibrating piece of the present invention and hence, it is possible to provide a high-quality and highly-reliable piezoelectric vibrator which can effectively suppress the vibration leakage while preventing the piezoelectric vibrator from becoming large-sized and maintaining sufficient rigidity of the piezoelectric vibrator.

Still further, according to the oscillator, the electronic device, and the radio-controlled timepiece of the present invention, it is possible to provide a high-quality and highly-reliable oscillator, electronic device, and radio-controlled timepiece while preventing these devices from becoming large-sized and maintaining sufficient rigidity of these devices.

DESCRIPTION OF THE PREFERRED EMBODIMENTS

Hereinafter, an embodiment of the present invention is explained in conjunction with drawings.
(Piezoelectric Vibrating Piece)

Figure 1:
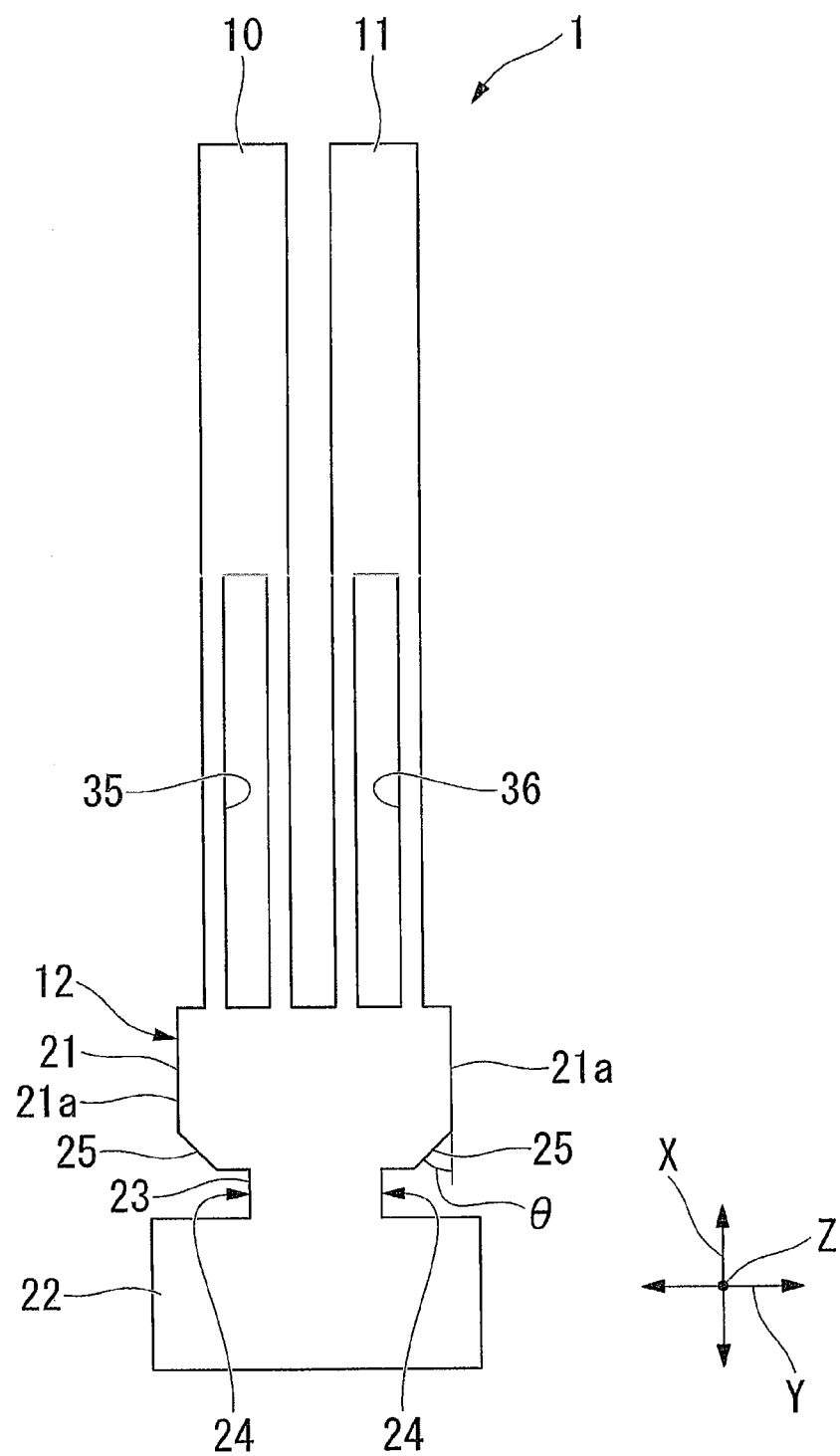
FIG. 1 is a plan view of a piezoelectric vibrating piece according to an embodiment of the present invention.

As shown in FIG. 1, the piezoelectric vibrating piece 1 is a tuning-fork-type vibrating piece which is made of a piezoelectric material such as crystal, lithium tantalate or lithium niobate. The piezoelectric vibrating piece 1 includes a pair of vibrating arm portions 10, 11 which is arranged so as to extend parallel to each other, and a plate-shaped base portion 12 to which longitudinal proximal end sides of the pair of vibrating arm portions 10, 11 are integrally fixed. In the explanation made hereinafter, the explanation is made assuming an extending direction of the piezoelectric vibrating piece 1 (the longitudinal direction of the vibrating arm portion 10, 11) as an X direction, a width direction of the piezoelectric vibrating piece 1 which is orthogonal to the X direction on a main surface of the piezoelectric vibrating piece 1 (a direction along which the vibrating arm portions 10, 11 are arranged) as a Y direction, and a thickness direction which is orthogonal to the X direction and the Y direction as a Z direction.

An excitation electrode not shown in the drawing which makes the pair of vibrating arm portions 10, 11 vibrate is formed on outer surfaces of the pair of vibrating arm portions 10, 11 respectively. Further, mount electrodes not shown in the drawing are formed on an outer surface of the base portion 12, and the mount electrodes and the excitation electrodes are electrically connected to each other via routing electrodes not shown in the drawing.

When a predetermined voltage is applied to these electrodes, due to an interaction between both excitation electrodes on the vibrating arm portions 10, 11, the vibrating arm portions 10, 11 vibrate in the direction that the vibrating arm portions 10, 11 approach each other or are separated from each other (Y direction) with predetermined resonance frequency.

As a modification of the piezoelectric vibrating piece 1, groove portions 35, 36 which are indented in the Z direction may be formed on both main surfaces of the vibrating arm portions 10, 11. As viewed in a plan view, each of these groove portions 35, 36 is formed into a rectangular shape whose longitudinal direction corresponds to the X direction, and extends from a proximal end side of the vibrating arm portion 10, 11 to an area in the vicinity of an approximately intermediate portion of the vibrating arm portion 10, 11. Due to such a constitution, the vibrating arm portion 10, 11 has a substantially H-shaped cross section on a plane orthogonal to an axial direction of the vibrating arm portion 10, 11.

Due to such a constitution, by forming the groove portion 35, 36 on the vibrating arm portion 10, 11, the excitation electrodes which make a pair at the vibrating arm portion 10, 11 face each other in an opposed manner on both side walls of the vibrating arm portion 10, 11 and hence, an electric field can be efficiently generated in the oppositely-facing direction. Accordingly, even when a width of the vibrating arm portion 10, 11 along the Y direction is narrowed, electric field efficiency can be enhanced so that it is possible to miniaturize the piezoelectric vibrating piece 1 while enhancing a quality of a product.

The above-mentioned base portion 12 is, as viewed in a plan view, formed into a rectangular shape whose longitudinal direction corresponds to the X direction. The base portion 12 includes: a connecting portion 21 which is positioned on a distal end side in the X direction (a vibrating arm portion 10, 11 side) and to which proximal end sides of the vibrating arm portions 10, 11 are fixed; a mount portion 22 which is positioned on a proximal end side in the X direction with respect to the connecting portion 21; and a narrow width portion 23 which is positioned between the connecting portion 21 and the mount portion 22 and whose length in the Y direction is smaller than a length of the connecting portion 21 and a length of the mount portion 22.

The mount portion 22 is a portion for mounting the base portion 12 on a package described later or the like, and the mounting electrodes described above are formed on an outer surface of the mount portion 22.

The narrow width portion 23 described above is formed on an intermediate portion of the base portion 12 in the X direction between a pair of cutaway portions 24 which are formed by cutting away the base portion 12 inwardly from both outer sides respectively in the Y direction. The narrow width portion 23 connects the connecting portion 21 and the mount portion 22 with each other integrally.

In manufacturing the piezoelectric vibrating piece 1 having such a constitution, firstly, a protective film having an outer shape pattern of the piezoelectric vibrating piece 1 having the vibrating arm portions 10, 11 and the base portion 12 is formed on both surfaces of a wafer not shown in the drawing by a photolithography technique. Here, the protective film having the outer shape pattern is formed such that portions of the protective film corresponding to areas where the cutaway portions 24 are formed are opened in the base portion 12. In forming the protective film, the protective film having a plurality of outer shape patterns is formed.

Next, using the protective film having the outer pattern as a mask, etching processing is applied to both surfaces of the wafer respectively. Due to such processing, outer shapes of the piezoelectric vibrating pieces 1 can be formed by selectively removing regions of the wafer which are not covered with the mask formed of the protective film having the outer shape pattern. In this state, the respective piezoelectric vibrating pieces 1 are connected to the wafer by way of the connecting portions not shown in the drawing.

Then, electrode films are formed on outer surfaces of the piezoelectric vibrating pieces 1 by patterning using a known method thus forming the excitation electrodes, the routing electrodes and the mount electrodes.

Finally, a cutting step is performed such that the plurality of piezoelectric vibrating pieces 1 are separated from the wafer by cutting the connecting portions which connect the wafer and the piezoelectric vibrating pieces 1 thus forming a plurality of individual piezoelectric vibrating pieces 1. Due to such steps, a plurality of tuning-fork-type piezoelectric vibrating pieces 1 can be manufactured from one wafer at one time.

(Chamfered Portion)

Figure 2:
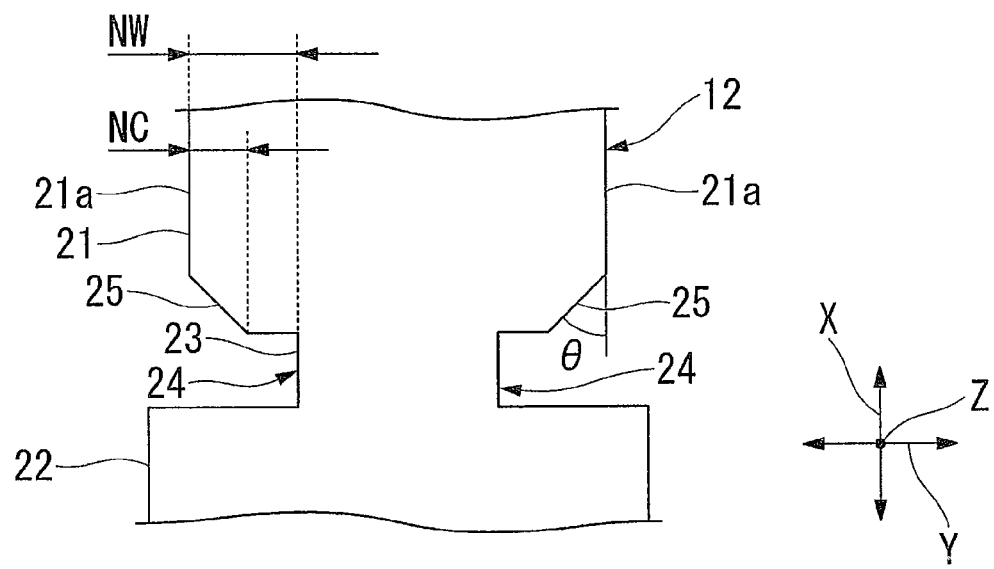
FIG. 2 is a plan view showing a chamfered portion formed on the piezoelectric vibrating piece.

As shown in FIG. 1 and FIG. 2, on both sides of the connecting portion 21 in the widthwise direction (Y direction), a chamfered portion (width reducing portion) 25 is formed on corner portions of the connecting portion 21 on a narrow width portion 23 side. Due to such chamfered portions 25, a cross-sectional area (width size) of the connecting portion 21 is gradually reduced toward the narrow width portion 23 from a distal end side (vibrating arm portion 10, 11 side). The chamfered portions 25 are formed by the above-mentioned etching as portions of the outer shape of the piezoelectric vibrating piece 1.

The chamfered portion 25 may be formed such that a tapered angle θ with respect to side surfaces 21a, 21a on both sides of the connecting portion 21 is set to 45°, 60° (θ=45°, 60°) or the like. It is particularly preferable to set the tapered angle θ of the chamfered portion 25 to 60° (θ=60°). By setting the tapered angle θ of the chamfered portion 25 to 60°, in forming an outer shape of the piezoelectric vibrating piece 1 by etching a piezoelectric plate, an etching residue (QE) attributed to a crystal azimuth of a piezoelectric material is hardly produced so that a tapered shape of the chamfered portion 25 can be formed with high accuracy. Accordingly, it is possible to reduce irregularities in a vibration leakage characteristic.

As described above, in this embodiment, by forming the chamfered portion 25 on both corner portions of the connecting portion 21 of the base portion 12 on a narrow width portion 23 side, a cross-sectional area of the connecting portion 21 can be gradually reduced toward the narrow width portion 23.

Due to such a constitution, a route through which vibrations excited by the vibrating arm portions 10, 11 propagate in the mount portion 22 can be narrowed and hence, the vibrations are confined in a vibrating arm portion 10, 11 side whereby the vibration leakage toward a mount portion 22 side can be suppressed. Accordingly, the vibration leakage can be effectively suppressed so that the rise of a CI value can be suppressed whereby the degradation of quality of an output signal can be suppressed.

Further, the rigidity (strength) of the piezoelectric vibrating piece 1 is determined by a cross-sectional area (cross-sectional area in the Y-Z directions) of the narrow width portion 23 and hence, even when the chamfered portion 25 is formed on both corner portions of the connecting portion 21 on a narrow width portion 23 side, the rigidity of the piezoelectric vibrating piece 1 is not particularly influenced.

That is, for reducing the vibration leakage, a method where a cross-sectional area of the narrow width portion 23 is decreased was adopted conventionally. According to the constitution of this embodiment, the vibration leakage can be reduced more without changing a cross-sectional area of the narrow width portion 23 and hence, there is no possibility that the rigidity of the piezoelectric vibrating piece 1 is lowered.

Accordingly, the vibration leakage can be effectively suppressed while preventing the piezoelectric vibrating piece 1 from becoming large-sized and maintaining sufficient rigidity of the piezoelectric vibrating piece 1.

A simulation is performed with respect to a change in a vibration leakage characteristic which takes place when a size of a chamfering size NC of the chamfered portion 25 formed on the above-mentioned piezoelectric vibrating piece 1 is changed, and the result of the simulation is described hereinafter.

While setting a cutaway size NW of the chamfered portion 25 from the side surface 21a of the connecting portion 21 to a bottom surface of the cutaway portion 24 to 80 mm, a chamfering size NC of the chamfered portion 25 whose tapered angle θ is 45° (θ=45°) is changed to a value which falls within a range from 0 to 75 μm, and a vibration leakage characteristic is obtained in terms of a vibration frequency change amount ΔF of the piezoelectric vibrating piece 1.

Assuming the vibration frequency of the piezoelectric vibrating piece 1 in the form of a single body as f1 and the vibration frequency of the piezoelectric vibrating piece 1 in a state where the piezoelectric vibrating piece 1 is mounted on the package as f2, the vibration frequency change amount ΔF can be expressed as follows.

$$\Delta F=(f2-f1)/f1$$

Figure 3:
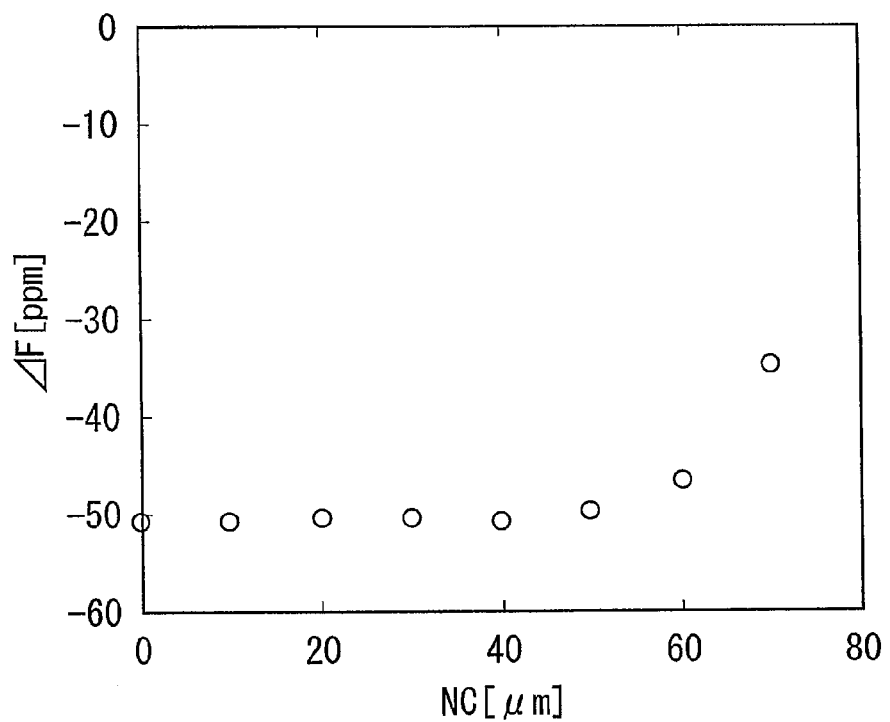
FIG. 3 is a graph showing a change in the number of vibrations of the piezoelectric vibrating piece when a size of chamfering is changed.

As a result, as shown in FIG. 3, it is confirmed that a vibration leakage amount can be suppressed by setting a chamfering size NC of the chamfered portion 25 to 40 μm or more. The reason is considered that, by setting the chamfering size NC to 40 μm or more, a route through which the vibrations excited by the vibrating arm portions 10, 11 propagate in the mount portion 22 can be sufficiently narrowed.

Accordingly, as shown in FIG. 2, when the tapered angle θ of the chamfered portion 25 is set to 45° (θ=45°), it is preferable to form the chamfered portion 25 such that a chamfering size NC of the chamfered portion 25 satisfies the following relationship with respect to a cutaway size NW from the side surface 21a of the connecting portion 21 to the bottom surface of the cutaway portion 24.

$$NC \geq 0.5 \times NW$$

That is, assuming the widthwise size of the portion where the corner chamfered portion is formed as NC and the widthwise size of the cutaway portion as NW, it is safe to say that the relationship of NC≥0.5×NW is established.

The substantially same result is obtained also when the tapered angle θ is set to 60° (θ=60°). Although the result obtained when the widthwise size NW is set to 80 μm is explained in this embodiment, the substantially same result is obtained also when the widthwise size NW is set to 60 μm, 100 μm and 120 μm. Accordingly, provided that the chamfering size NC is set to satisfy the relationship NC≥0.5×NW, the remarkable vibration leakage lowering effect can be acquired.

(First Modification)

Figure 4:
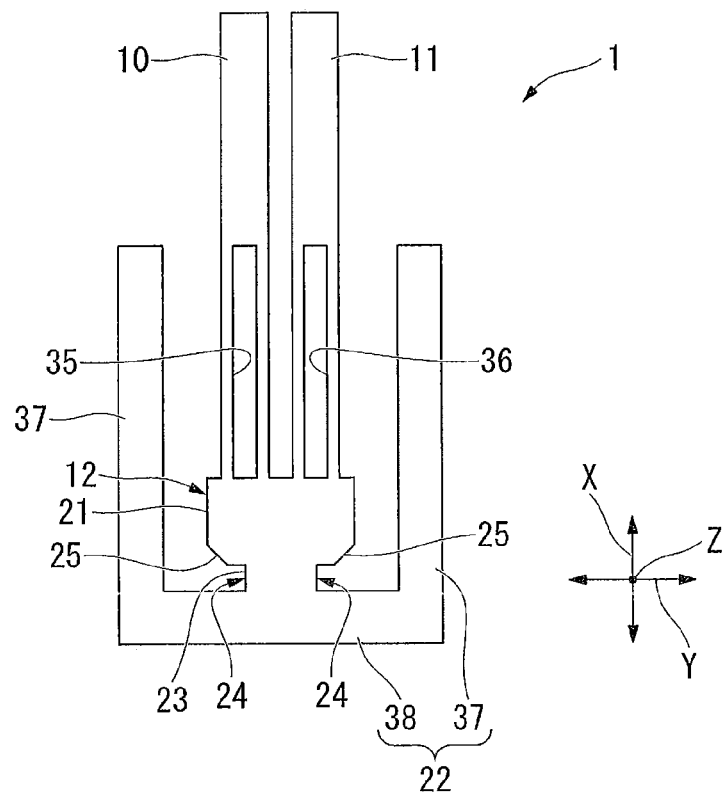
FIG. 4 is a plan view showing another constitution of the piezoelectric vibrating piece.

As shown in FIG. 4, in a piezoelectric vibrating piece 1 according to this embodiment, a pair of side arms 37 is integrally formed with a mount portion 22 of a base portion 12 (so-called side arm type). To be more specific, the mount portion 22 of this modification includes a mount portion body 38 which is arranged on a side opposite to a connecting portion 21 along the X direction with a narrow width portion 23 sandwiched therebetween, and the pair of side arms 37 which is arranged on both sides of the mount portion body 38 in the Y direction and extends along the X direction.

The respective side arms 37 extend toward both sides in the Y direction from the mount portion body 38 respectively and extend toward a vibrating arm portion 10, 11 side along the X direction from outer end portions of the extending portions thus forming an L shape as viewed in a plan view. That is, the respective side arms 37 are positioned on both sides of the base portion 12 and the proximal end portions of the vibrating arm portions 10, 11 in the Y direction, and distal end portions of the respective side arms 37 are positioned at intermediate portions of the vibrating arm portions 10, 11 in the X direction.

In this case, the piezoelectric vibrating piece 1 can be mounted in a package or the like, for example, by way of the distal end portions of the side arms 37.

Further, on both sides of the connecting portion 21 in the widthwise direction (Y direction), chamfered portions 25 substantially equal to the chamfered portions 25 in the above-mentioned embodiment are formed on corner portions on a narrow width portion 23 side respectively.

Due to such a constitution, by forming the chamfered portions 25 and the narrow width portion 23, a route through which vibrations excited by the vibrating arm portions 10, 11 propagate in the base portion 12 can be narrowed and hence, the vibrations can be confined in a vibrating arm portion 10, 11 side whereby the leakage of vibrations toward a base portion 12 side can be suppressed. Accordingly, the vibration leakage can be effectively suppressed so that the rise of a CI value can be suppressed whereby the degradation of quality of an output signal can be suppressed.

Accordingly, the vibration leakage can be effectively suppressed while preventing the piezoelectric vibrating piece 1 from becoming large-sized and maintaining sufficient rigidity of the piezoelectric vibrating piece 1.

Particularly, in the side-arm-type piezoelectric vibrating piece 1 of this modification, at the base portion 12, a long distance can be ensured between the connecting portion 21 with the vibrating arm portions 10, 11 and the mount portion (distal end portion of the side arm 37). As a result, without increasing a total length of the piezoelectric vibrating piece 1, it is possible to suppress the rise of a CI value by suppressing vibration leakage so that the degradation of quality of an output signal can be suppressed.

(Second Modification)

Figure 5:
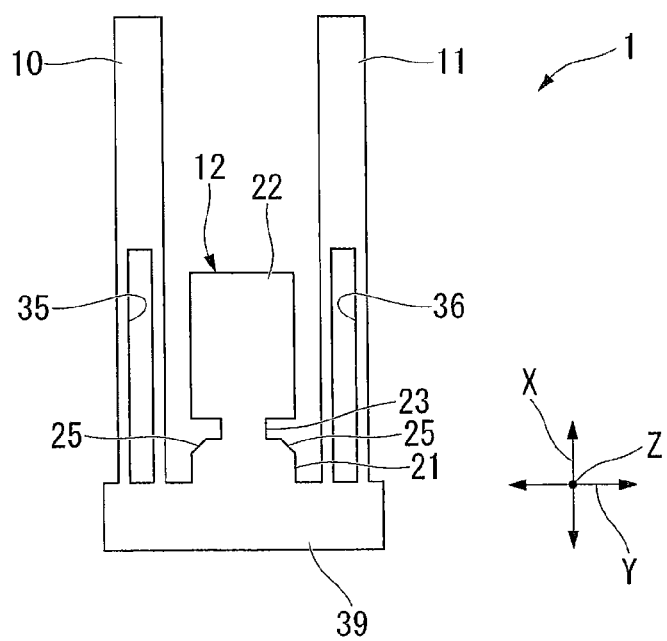
FIG. 5 is a plan view showing another constitution of the piezoelectric vibrating piece.

As shown in FIG. 5, in a piezoelectric vibrating piece 1 of this modification, vibrating arm portions 10, 11 are arranged in a spaced-apart manner in the widthwise direction (Y direction), and proximal portions of the vibrating arm portions 10, 11 are connected to each other by a joining portion 39 which extends in the Y direction.

Further, between the vibrating arm portions 10, 11, a connecting portion 21 is formed while extending in the same direction as the vibrating arm portions 10, 11 extend with respect to the joining portion 39. A narrow width portion 23 and a mount portion 22 are continuously formed on the connecting portion 21 from a joining portion 39 side along the X direction (so-called center arm type).

On both sides of the above-mentioned connecting portion 21 in the widthwise direction (Y direction), chamfered portions 25 substantially equal to the chamfered portions 25 in the above-mentioned embodiment are formed on corner portions on a narrow width portion 23 side respectively.

Due to such a constitution, by forming the chamfered portions 25 and the narrow width portion 23, a route through which vibrations excited by the vibrating arm portions 10, 11 propagate in the base portion 12 can be narrowed and hence, the vibrations can be confined in a vibrating arm portion 10, 11 side whereby the leakage of vibrations toward a base portion 12 side can be suppressed. Accordingly, the vibration leakage can be effectively suppressed so that the rise of a CI value can be suppressed whereby the degradation of quality of an output signal can be suppressed.

Accordingly, the vibration leakage can be effectively suppressed while preventing the piezoelectric vibrating piece 1 from becoming large-sized and maintaining sufficient rigidity of the piezoelectric vibrating piece 1.

Particularly, in the center-arm-type piezoelectric vibrating piece 1 of this modification, a long distance can be ensured between the vibrating arm portions 10, 11 and the mount portion 22. As a result, without increasing a total length of the piezoelectric vibrating piece 1, it is possible to suppress the rise of a CI value by suppressing vibration leakage so that the degradation of quality of an output signal can be suppressed.

Hereinafter, the explanation is made with respect to a plurality of modifications of the width reducing portion which can be adopted in place of the chamfered portions 25 provided in the above-mentioned embodiment and first and second modifications.

(Third Modification)

Figures 6A, 6B, 6C:
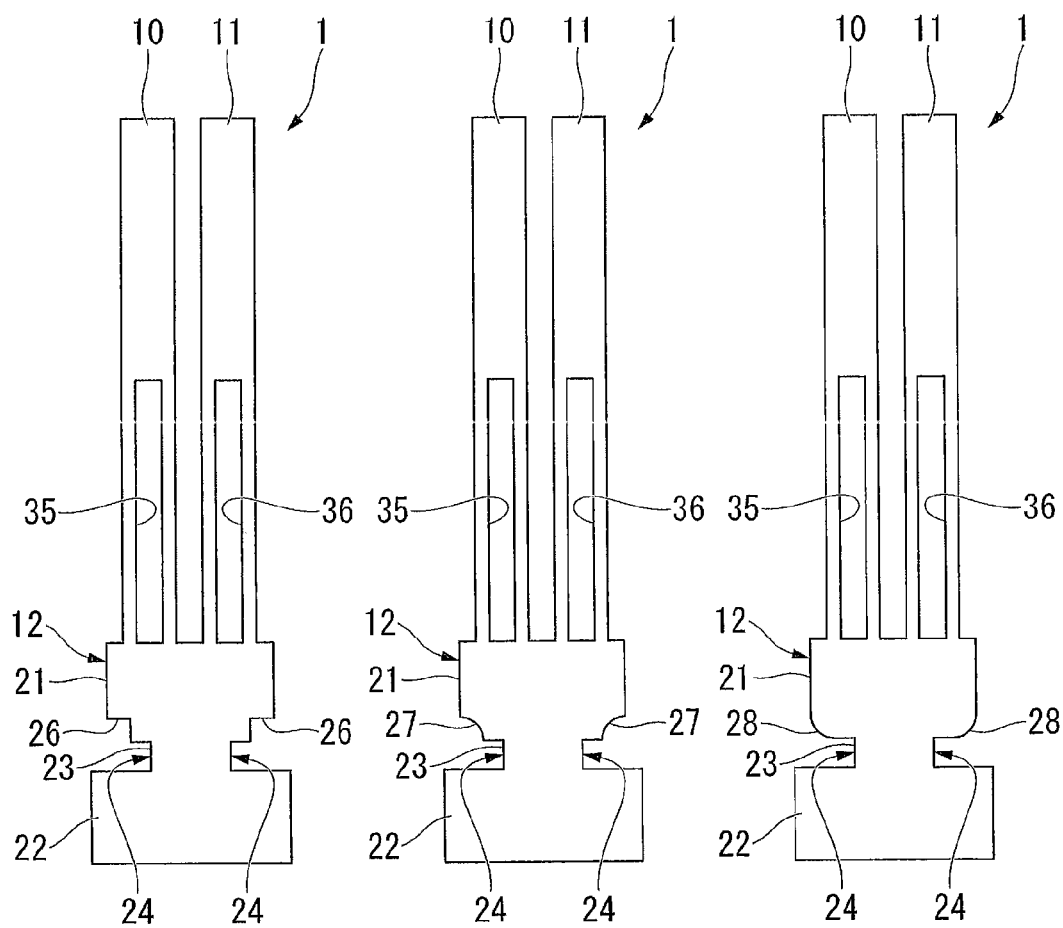
FIG. 6A to FIG. 6C are plan views showing another constitution of the piezoelectric vibrating piece.

As shown in FIG. 6A, in a piezoelectric vibrating piece 1 of this modification, a stepped portion (width reducing portion) 26 is formed on both corner portions of a connecting portion 21 of a base portion 12 on a narrow width portion 23 side thus decreasing a cross-sectional area of the connecting portion 21 toward the narrow width portion 23 in a stepwise manner Here, the stepped portion 26 forms a V-shaped concave shape where bottom angle is 90° as viewed in the thickness direction of the piezoelectric vibrating piece 1.

Due to such a constitution, by forming the stepped portion 26 and the narrow width portion 23, a route through which vibrations excited by the vibrating arm portions 10, 11 propagate in the mount portion 22 can be narrowed and hence, the vibrations can be confined in a vibrating arm portion 10, 11 side whereby the leakage of vibrations toward a mount portion 22 side can be suppressed. Accordingly, the vibration leakage can be effectively suppressed so that the rise of a CI value can be suppressed whereby the degradation of quality of an output signal can be suppressed.

Accordingly, the vibration leakage can be effectively suppressed while preventing the piezoelectric vibrating piece 1 from becoming large-sized and maintaining sufficient rigidity of the piezoelectric vibrating piece 1.

(Fourth Modification)

As shown in FIG. 6B, in a piezoelectric vibrating piece 1 of this modification, a recessed portion (width reducing portion) 27 is formed on both corner portions of a connecting portion 21 of a base portion 12 on a narrow width portion 23 side thus gradually decreasing a cross-sectional area of the connecting portion 21 toward the narrow width portion 23. Here, the recessed portion 27 forms an approximately arcuate concave shape as viewed in the thickness direction of the piezoelectric vibrating piece 1.

Due to such a constitution, by forming the recessed portion 27 and the narrow width portion 23, a route through which vibrations excited by the vibrating arm portions 10, 11 propagate in the mount portion 22 can be narrowed and hence, the vibrations can be confined in a vibrating arm portion 10, 11 side whereby the leakage of vibrations toward a mount portion 22 side can be suppressed. Accordingly, the vibration leakage can be effectively suppressed so that the rise of a CI value can be suppressed whereby the degradation of quality of an output signal can be suppressed.

Accordingly, the vibration leakage can be effectively suppressed while preventing the piezoelectric vibrating piece 1 from becoming large-sized and maintaining sufficient rigidity of the piezoelectric vibrating piece 1.

(Fifth Modification)

As shown in FIG. 6C, in a piezoelectric vibrating piece 1 of this modification, an arcuate portion (width reducing portion, rounded chamfered portion) 28 is formed on both corner portions of a connecting portion 21 of a base portion 12 on a narrow width portion 23 side thus gradually decreasing a cross-sectional area of the connecting portion 21 toward the narrow width portion 23. Here, the arcuate portion 28 forms an approximately arcuate convex shape as viewed in the thickness direction of the piezoelectric vibrating piece 1.

Due to such a constitution, by forming the arcuate portion 28 and the narrow width portion 23, a route through which vibrations excited by the vibrating arm portions 10, 11 propagate in the mount portion 22 can be narrowed and hence, the vibrations can be confined in a vibrating arm portion 10, 11 side whereby the leakage of vibrations toward a mount portion 22 side can be suppressed. Accordingly, the vibration leakage can be effectively suppressed so that the rise of a CI value can be suppressed whereby the degradation of quality of an output signal can be suppressed.

Accordingly, the vibration leakage can be effectively suppressed while preventing the piezoelectric vibrating piece 1 from becoming large-sized and maintaining sufficient rigidity of the piezoelectric vibrating piece 1.

(Piezoelectric Vibrator)

Next, a piezoelectric vibrator 50 which uses the piezoelectric vibrating piece 1 of this embodiment is explained. Here, the piezoelectric vibrating piece 1 adopts the constitution shown in FIG. 4, and the constitutions substantially equal to the constitutions of the above-mentioned embodiment and modifications are given the same symbols and the explanation of these constitutions is omitted. It is also needless to say that this embodiment may adopt a piezoelectric vibrating piece having the constitution of the above-mentioned embodiment or each modification as the piezoelectric vibrating piece 1.

As shown in FIG. 7 to FIG. 10, the piezoelectric vibrator 50 of this embodiment is a surface-mounting-type vibrator which includes: a box-like package 53 where a base substrate 51 and a lid substrate 52 are bonded to each other by anodic bonding or by way of a bonding film or the like not shown in the drawing, for example; and a piezoelectric vibrating piece 1 which is housed in a cavity C formed in the inside of the package 53 and is mounted on the base substrate 51.

Figure 7:
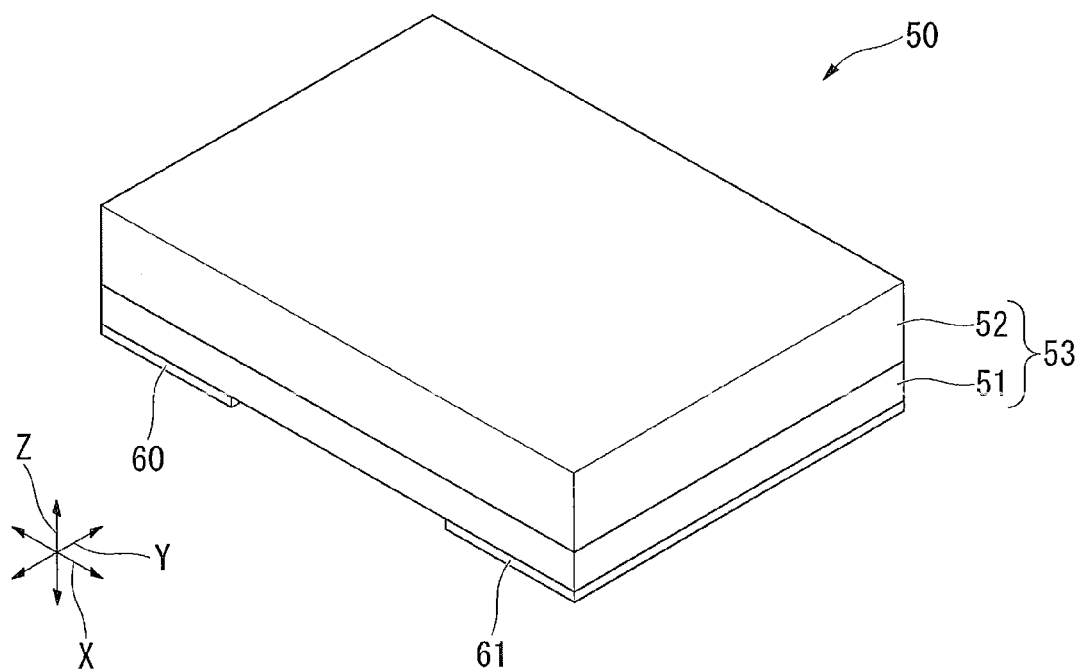
FIG. 7 is a perspective view showing the external appearance of a piezoelectric vibrator according to an embodiment of the present invention.
Figure 8:
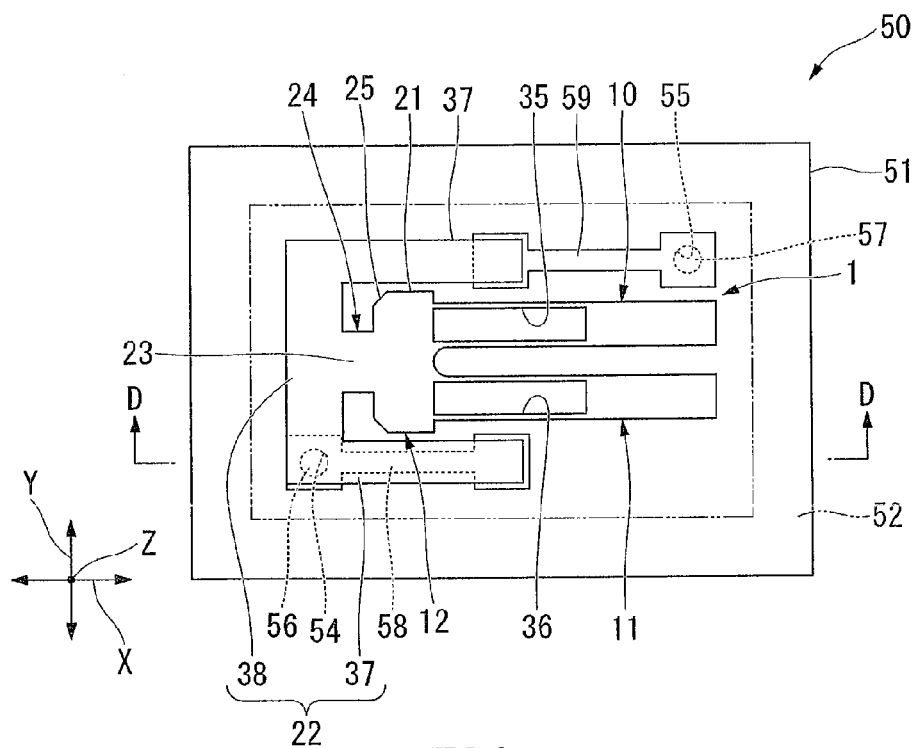
FIG. 8 is a constitutional view showing the inside of the piezoelectric vibrator shown in FIG. 7, and is also a plan view of the piezoelectric vibrator in a state where a lid substrate is removed.

As shown in FIG. 7 and FIG. 8, the base substrate 51 and the lid substrate 52 are transparent insulation substrates made of a glass material such as soda-lime glass, for example, which are formed into an approximately plate shape. On a bonding surface side of the lid substrate 52 to which the base substrate 51 is bonded, a rectangular-shaped recessed portion 52a in which the piezoelectric vibrating piece 1 is housed is formed. The recessed portion 52a functions as a recessed portion defining the cavity C in which the piezoelectric vibrating piece 1 is housed when the base substrate 51 and the lid substrate 52 overlap with each other in an opposedly facing manner.

As shown in FIG. 8, a pair of through holes 54, 55 which penetrates the base substrate 51 in the Z direction is formed in the base substrate 51. The through holes 54, 55 are formed at positions where the through holes 54, 55 are arranged within the cavity C. To explain the structure in more detail, the through holes 54, 55 of this embodiment are formed such that one through hole 54 is formed at a position corresponding to a base portion 12 side of the mounted piezoelectric vibrating piece 1(a proximal end side of the side arm 37), and the other through hole 55 is formed at a position corresponding to a distal end side of the vibrating arm portions 10, 11.

Further, a pair of through electrodes 56, 57 is formed in the pair of through holes 54, 55 so as to fill the through holes 54, 55. The through electrodes 56, 57 are conductive cores which are integrally fixed to the through holes 54, 55, for example, and the through electrodes 56, 57 are formed such that both ends are flat and a thickness of the through electrodes 56, 57 is substantially equal to a thickness of the base substrate 51. Due to such a constitution, the electric conductance can be ensured on both surfaces of the base substrate 51 while maintaining the air-tightness in the cavity C.

Here, the through electrodes 56, 57 are not limited to the above-mentioned constitution. For example, the through electrode 56, 57 may be formed such that, after a metal pin not shown in the drawing is inserted into the through hole 54, 55, glass frit is filled in a gap defined between the through hole 54, 55 and the metal pin and the filled glass frit is baked. Further, the through electrode 56, 57 may be a conductive adhesive agent which is embedded in the inside of the through hole 54, 55.

Figure 9:
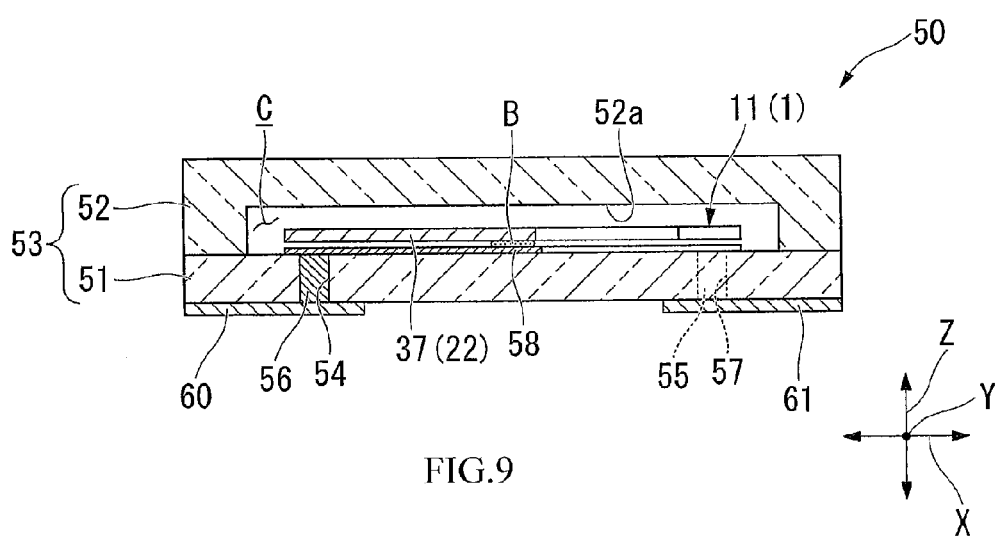
FIG. 9 is a cross-sectional view of the piezoelectric vibrator taking along a line D-D in FIG. 8.
Figure 10:
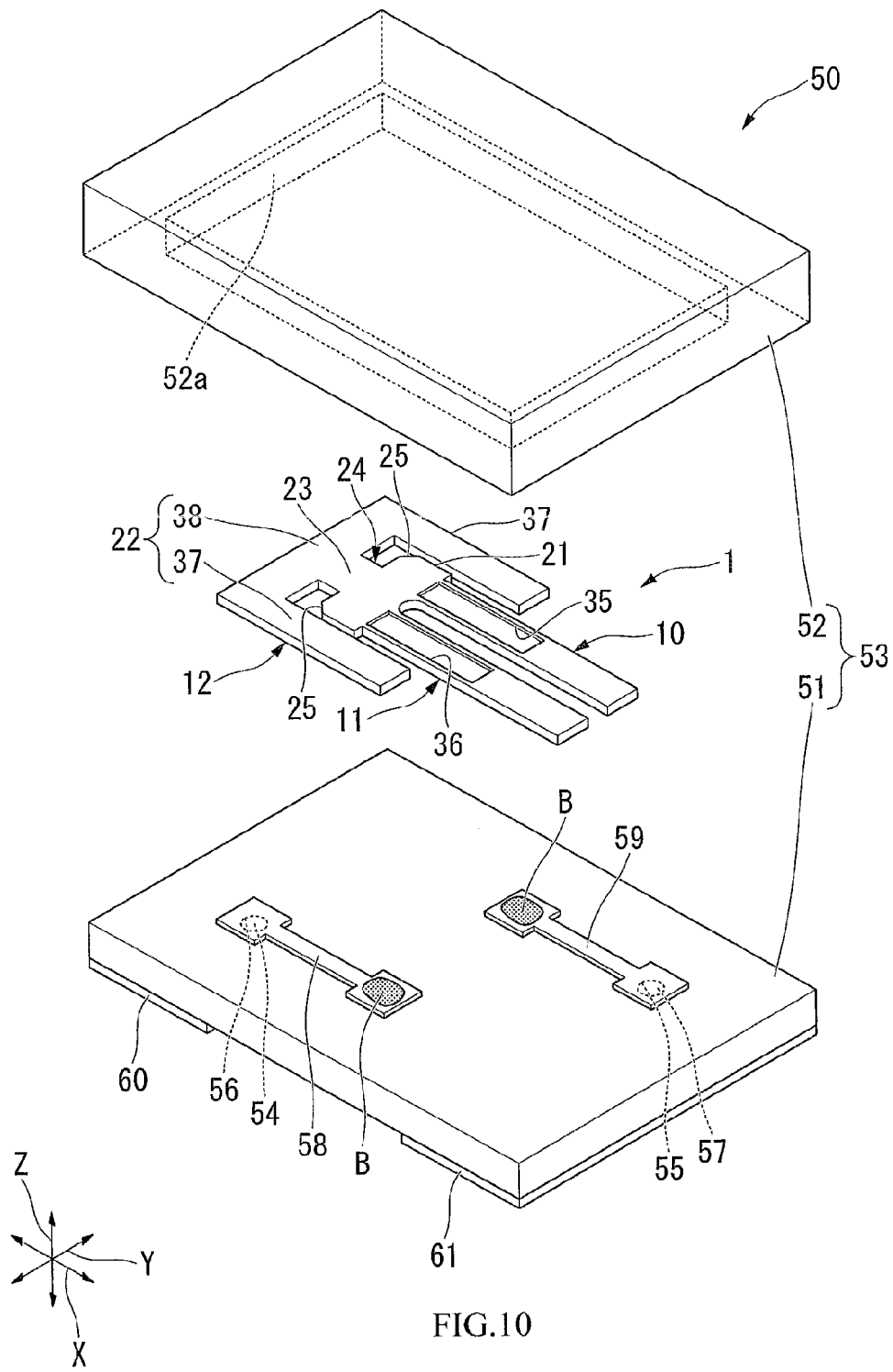
FIG. 10 is an exploded perspective view of the piezoelectric vibrator shown in FIG. 7.

As shown in FIG. 9 and FIG. 10, a pair of routing electrodes 58, 59 is formed on an upper surface side (a bonding surface side to which the lid substrate 52 is bonded) of the base substrate 51 by patterning. Out of the pair of routing electrodes 58, 59, one routing electrode 58 extends along the X direction on one end side of the base substrate 51 in the Y direction. To be more specific, one end side of the routing electrode 58 in the X direction covers the through electrode 56, while the other end side of the routing electrode 58 in the X direction is arranged on an intermediate portion of the base substrate 51 in the X direction.

Further, the other routing electrode 59 extends along the X direction on the other end side of the base substrate 51 in the Y direction. To be more specific, the routing electrode 59 has one end side in the X direction thereof arranged on the intermediate portion of the base substrate 51 in the X direction, while the other end side of the routing electrode 59 in the X direction covers the through electrode 57. Accordingly, the other end side of the routing electrode 58 in the X direction and one end side of the routing electrode 59 in the X direction are arranged at the same position of the base substrate 51 in the X direction, more specifically, at the position where the other end side of the routing electrode 58 in the X direction and one end side of the routing electrode 59 in the X direction overlap with the distal end portions of the side arms 37 of the piezoelectric vibrating piece 1 as viewed in a plan view.

Further, a bump B made of gold or the like is formed on the other end sides of the pair of routing electrodes 58, 59 respectively. The piezoelectric vibrating piece 1 is mounted on the bumps B in a state where mount electrodes which are formed on the mount portion 22 of the base portion 12 are brought into contact with the bumps B. Due to such a constitution, the piezoelectric vibrating piece 1 is brought into a state where the piezoelectric vibrating piece 1 is supported in a floating state from the base substrate 51, and the piezoelectric vibrating piece 1 is electrically connected to the routing electrodes 58, 59 respectively.

In this embodiment, the mount electrodes are formed such that the mount electrodes extend to the distal end portions of the side arms 37, and the mount electrodes are connected to the routing electrodes 58, 59 by way of the bumps B.

Further, as shown in FIGS. 7 to 10, external electrodes 60, 61 which are electrically connected to the pair of through electrodes 56, 57 respectively are formed on a lower surface of the base substrate 51.

In operating the piezoelectric vibrator 50 having such a constitution, a predetermined drive voltage is applied to the external electrodes 60, 61 formed on the base substrate 51. Due to such applying of a drive voltage, it is possible to supply an electric current to the excitation electrodes of the piezoelectric vibrating piece 1 so that the pair of vibrating arm portions 10, 11 can be vibrated at predetermined resonance frequency in the direction (Y direction) that the vibrating arm portions 10, 11 approach each other or are separated from each other. Further, by making use of the vibrations of the pair of vibrating arm portions 10, 11, the piezoelectric vibrator 50 can be used as a time source, a timing source of a control signal, a reference signal source or the like.

Further, according to the piezoelectric vibrator 50 of this embodiment, the piezoelectric vibrator 50 includes the above-mentioned piezoelectric vibrating piece 1 and hence, when the piezoelectric vibrating piece 1 is mounted in the inside of the cavity C, it is possible to provide a high-quality and highly-reliable piezoelectric vibrator 50 which can effectively suppress the vibration leakage while maintaining sufficient rigidity and preventing the piezoelectric vibrator 50 from becoming large-sized.

(Oscillator)

Figure 11:
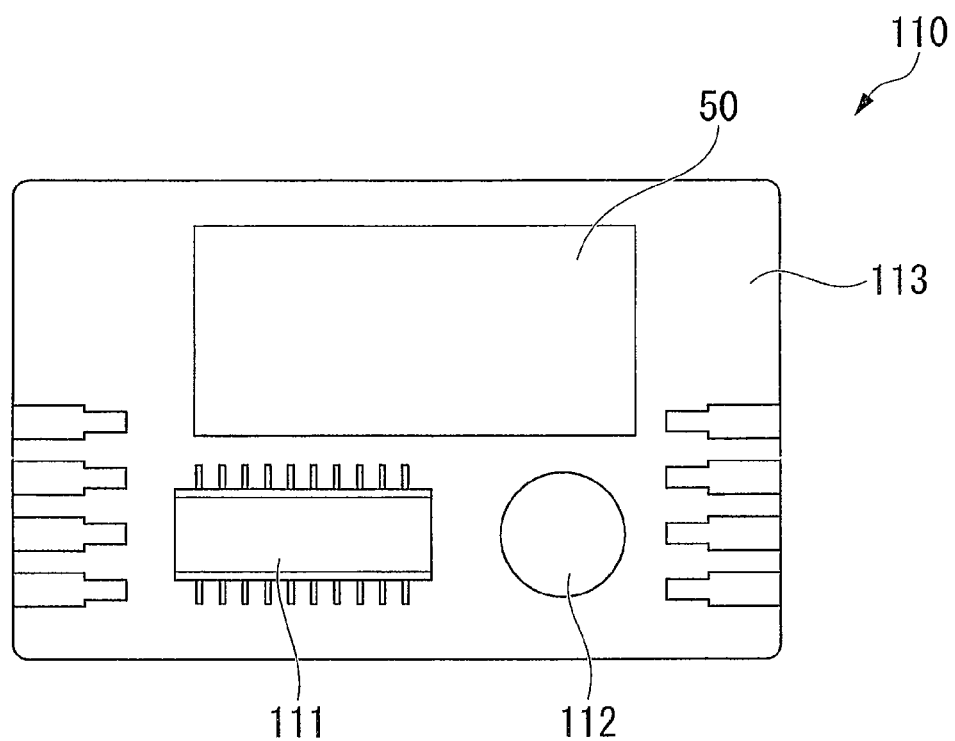
FIG. 11 a schematic constitutional view of an oscillator according to the embodiment of the present invention.

Next, one embodiment of the oscillator according to the present invention is explained in conjunction with FIG. 11.

The oscillator 110 of this embodiment is, as shown in FIG. 11, formed such that the piezoelectric vibrator 50 is electrically connected to an integrated circuit 111 to function as an oscillator element. The oscillator 110 includes a substrate 113 on which an electronic element part 112 such as a capacitor is mounted. The above-mentioned integrated circuit 111 for oscillator is mounted on the substrate 113, and the piezoelectric vibrating piece of the piezoelectric vibrator 50 is mounted on the substrate 113 in the vicinity of the integrated circuit 111. The electronic element part 112, the integrated circuit 111 and the piezoelectric vibrator 50 are electrically connected with each other by a wiring pattern not shown in the drawing. The respective constitutional parts are molded by a resin not shown in the drawing.

In the oscillator 110 having such a constitution, when a voltage is applied to the piezoelectric vibrator 50, the piezoelectric vibrating piece 1 arranged in the inside of the piezoelectric vibrator 50 vibrates. This vibration is converted into an electric signal due to a piezoelectric characteristic which the piezoelectric vibrating piece 1 possesses, and is inputted to the integrated circuit 111 as the electric signal. Various processing are applied to the inputted electric signal by the integrated circuit 111, and the inputted electric signal is outputted as a frequency signal. Accordingly, the piezoelectric vibrator 50 functions as an oscillator element.

Further, by selectively setting the constitution of the integrated circuit 111, for example, an RTC (real time clock) module or the like corresponding to a request, it is possible to impart, besides a function as a timepiece-use single-function oscillator or the like, a function of controlling an operation date and time of the oscillator or an external device or a function of providing time, calendar and the like to the oscillator 110.

According to the oscillator 110 of this embodiment, the oscillator 110 includes the above-mentioned piezoelectric vibrator 50 and hence, it is possible to provide the highly-reliable and high-quality oscillator 110 while maintaining the sufficient rigidity of the oscillator 110 and preventing the oscillator 110 from becoming large-sized.

(Electronic Device)

Figure 12:
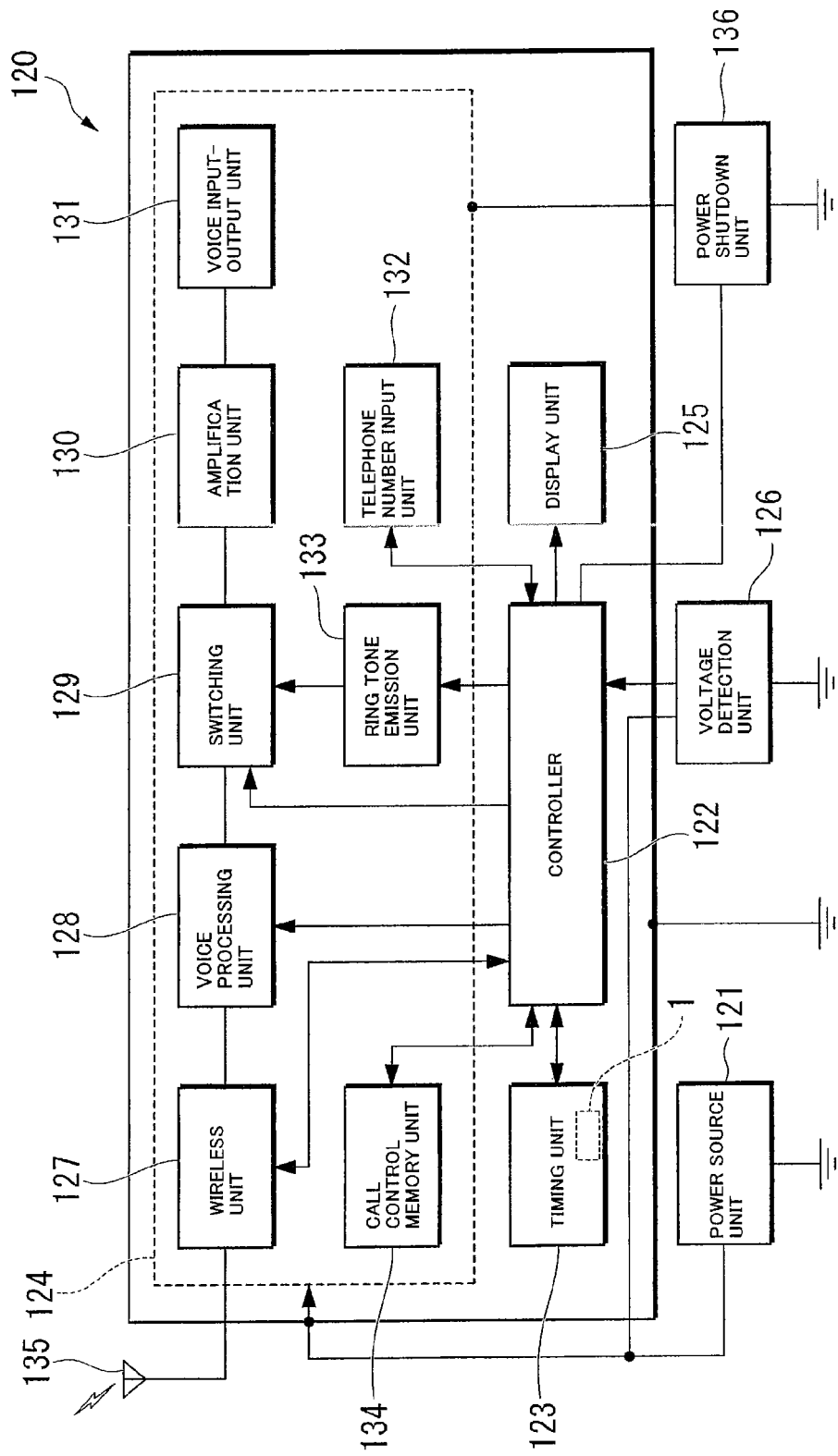
FIG. 12 is a schematic constitutional view of a personal digital assistant according to the embodiment of the present invention.

Next, one embodiment of the electronic device according to the present invention is explained in conjunction with FIG. 12. The explanation is made by taking a portable information device 120 which includes the above-mentioned piezoelectric vibrator 50 as an example of the electronic device.

Firstly, the portable information device 120 of this embodiment is a device which is represented by a mobile phone, for example, and is a developed or improved form of a conventional wrist watch. The portable information device 120 resembles the wrist watch in appearance. A liquid crystal display is arranged on a portion of the portable information device 120 which corresponds to a dial of the wrist watch, and a present time and the like can be displayed on a screen of the liquid crystal display. Further, when the portable information device 120 is used as a communication device, a user removes the portable information device 120 from his or her wrist, and performs communication in the same manner as a mobile phone of the related art by a speaker and a microphone incorporated into an inner portion of a band. However, the portable information device 120 is remarkably miniaturized and light-weighted compared to the mobile phone of the related art.

Next, the constitution of the portable information device 120 of this embodiment is explained. The portable information device 120 includes, as shown in FIG. 12, a piezoelectric vibrator 50 and a power source part 121 for power supply. The power source part 121 is formed of a lithium secondary battery, for example. To the power source part 121, a control part 122 which performs various controls, a timer part 123 which counts time or the like, a communication part 124 which performs communication with the outside, a display part 125 which displays various information, and a voltage detection part 126 which detects voltages of the respective functional parts are connected to each other in parallel. Electricity is supplied to the respective functional parts from the power source part 121.

The control part 122 performs an operational control of the whole system such as the transmission and the reception of voice data and the measurement, display and the like of a present time by controlling the respective functional parts. Further, the control part 122 includes a ROM in which programs are preliminarily written, a CPU which reads and executes the programs written in the ROM, a RAM which is used as a work area of the CPU and the like.

The timer part 123 includes an integrated circuit which incorporates an oscillation circuit, a register circuit, a counter circuit, an interface circuit and the like therein, and the piezoelectric vibrator 50. When a voltage is applied to the piezoelectric vibrator 50, the piezoelectric vibrating piece vibrates, and the vibrations are converted into an electric signal due to a piezoelectric characteristic which crystal possesses, and is inputted to the oscillation circuit as the electric signal. An output of the oscillation circuit is binalized and the binalized value is counted by the register circuit and the counter circuit. Then, the transmission/reception of signals is performed between the timer part 123 and the control part 122 via the interface circuit, and a present time, a present date, calendar information and the like are displayed on the display part 125.

The communication part 124 has the substantially same functions as a mobile phone of the related art, and includes a wireless part 127, a voice processing part 128, a switching part 129, an amplifying part 130, a voice inputting/outputting part 131, a telephone number inputting part 132, an incoming call sound generation part 133, and a calling-control memory part 134.

The wireless part 127 performs the transmission/reception of various data such as voice data with a base station through an antenna 135. The voice processing part 128 performs coding and decoding of a voice signal inputted from the wireless part 127 or the amplifying part 130. The amplifying part 130 amplifies a signal inputted from the voice processing part 128 or the voice inputting/outputting part 131 to a predetermined level. The voice inputting/outputting part 131 is formed of a speaker, a microphone or the like, and makes an incoming call sound or a received voice loud or collects voice.

Further, the incoming call sound generation part 133 generates an incoming call sound in response to calling from the base station. The switching part 129 switches the amplifying part 130 connected to the voice processing part 128 to the incoming call sound generation part 133 when a call arrives so that the incoming call sound generated by the incoming call sound generation part 133 is outputted to the voice inputting/outputting part 131 through the amplifying part 130.

Here, the calling control memory part 134 stores a program relating to an incoming/outgoing call control in communication. Further, the telephone number inputting part 132 includes, for example, numeral keys ranging from 0 to 9 and other keys. By pushing these numeral keys or the like, a user can input the telephone number of call destination or the like.

The voltage detection part 126, when a voltage applied to the respective functional parts such as the control part 122 from the power source part 121 becomes lower than a predetermined value, detects such lowering of voltage and notifies the lowering of voltage to the control part 122. The predetermined voltage value at this point of time is a value which is preliminarily set as a minimum voltage necessary for stably operating the communication part 124, and is set to approximately 3V, for example. The control part 122 which receives the notification of lowering of voltage from the voltage detection part 126 prohibits operations of the wireless part 127, the voice processing part 128, the switching part 129 and the incoming call sound generation part 133. Particularly, the operation stop of the wireless part 127 which consumes large power is inevitable. Further, a message that a remaining battery quantity is short so that the communication part 124 is inoperable is displayed on the display part 125.

That is, due to the combined operation of the voltage detection part 126 and the control part 122, an operation of the communication part 124 can be prohibited and a message which indicates the prohibition of the operation of the communication part 124 can be displayed on the display part 125. This display may be formed of a character message. However, as a more intuitive display, a x (bad) mark may be attached to a telephone icon displayed on an upper part of a display screen of the display part 125.

The electronic device is provided with a power source breaking part 136 which can selectively break a power source of a portion relating to a function of the communication part 124. In this case, it is possible to stop the function of the communication part 124 more reliably.

According to the portable information device 120 of this embodiment, the portable information device 120 includes the above-mentioned piezoelectric vibrator 50 and hence, it is possible to provide the highly-reliable and high-quality portable information device 120 while maintaining the sufficient rigidity of the portable information device 120 and preventing the portable information device 120 from becoming large-sized.

(Radio-controlled Timepiece)

Figure 13:
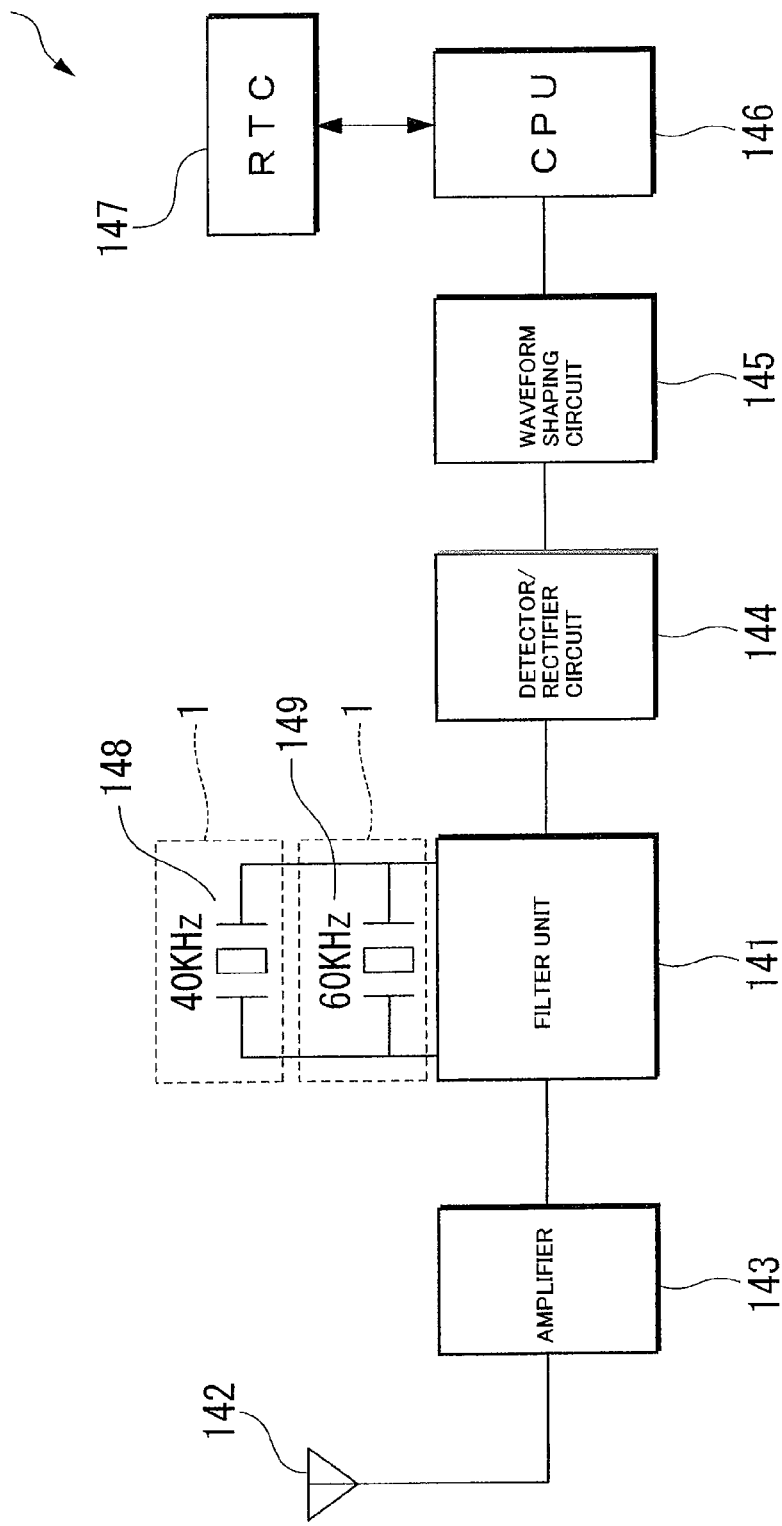
FIG. 13 is a schematic constitutional view of a radio-controlled timepiece according to the embodiment of the present invention

Next, one embodiment of the radio-controlled timepiece according to the present invention is explained in conjunction with FIG. 13.

The radio-controlled timepiece 140 of this embodiment is, as shown in FIG. 13, a timepiece which includes the piezoelectric vibrator 50 which is electrically connected to a filter part 141, and has a function of receiving a standard electric wave containing timepiece information, automatically correcting time to correct time, and displaying the corrected time.

In Japan, transmission installations (transmission stations) which transmit the standard electric wave are located in Fukushima prefecture (40 kHz) and Saga prefecture (60 kHz) and transmit the standard electric waves respectively. A long wave having frequency of 40 kHz or 60 kHz has both of property that the wave propagates on a ground and property that the wave propagates while being reflected between an ionosphere and a ground and hence, the long wave has a wide propagation range whereby the standard electric wave can cover all areas of Japan with the above-mentioned two transmission installations.

The functional constitution of the radio-controlled timepiece 140 is explained in detail hereinafter.

An antenna 142 receives the standard electric wave formed of a long wave having frequency of 40 kHz or 60 kHz. The standard electric wave formed of a long wave is an electric wave which is obtained by AM-modulating a carrier wave having frequency of 40 kHz or 60 kHz by time information called as a time code. The received standard electric wave formed of a long wave is amplified by an amplifier 143, and is filtered by a filter part 141 having a plurality of piezoelectric vibrators 50, and is tuned.

The piezoelectric vibrators 50 of this embodiment include crystal vibrator parts 148, 149 having resonance frequency of 40 kHz or 60 kHz as same as the above-mentioned frequency of the carrier frequency respectively.

Further, a filtered signal of predetermined frequency is detected and demodulated by a detection/rectifying circuit 144.

Subsequently, the time code is taken out through a waveform shaping circuit 145, and is counted by a CPU 146. The CPU 146 reads information on a present year, cumulative days, a day of a week, time and the like. The read information is reflected on an RTC 147 so that correct time information is displayed.

The carrier wave has frequency of 40 kHz or 60 kHz and hence, crystal vibrator parts 148, 149 are preferably formed of a vibrator having the above-mentioned tuning-fork structure.

Although the above-mentioned explanation is made with respect to the radio-controlled timepiece used in Japan, the frequencies of standard electric waves of a long wave used overseas differ from the standard electric wave used in Japan.

For example, the standard electric wave having frequency of 77.5 kHz is used in Germany. Accordingly, in incorporating the radio-controlled timepiece 140 also compatible with the oversea use into a portable device, the piezoelectric vibrator 50 having frequency different from the frequency used in Japan becomes necessary.

According to the radio-controlled timepiece 140 of this embodiment, the radio-controlled timepiece 140 includes the above-mentioned piezoelectric vibrator 50 and hence, it is possible to provide the highly-reliable and high-quality radio-controlled timepiece 140 while maintaining the sufficient rigidity of the radio-controlled timepiece 140 and preventing the radio-controlled timepiece 140 from becoming large-sized.

The technical scope of the present invention is not limited to the above-mentioned embodiments, and various modifications are conceivable without departing from the gist of the present invention.

For example, in the above-mentioned embodiment, although the piezoelectric vibrating piece 1 of the present invention is adopted as the surface-mounted-type piezoelectric vibrator 50, the present invention is not just limited to the above-mentioned embodiment, and the piezoelectric vibrating piece 1 of the present invention may be applicable to a cylinder-package-type piezoelectric actuator.

Besides the above-mentioned modifications, it is possible to make a choice among the above-mentioned constitutions and to suitably change the above-mentioned constitution to other constitution without departing from the gist of the present invention.

The invention claimed is:

1. A piezoelectric vibrating piece comprising:
a pair of vibrating arm portions parallel to each other and extending in a longitudinal direction and having proximal end sides; and
a base portion including:
a connecting portion having a length in a widthwise direction orthogonal to the longitudinal direction and having the proximal end sides of the vibrating arm portion fixed thereto;
a mount portion having a length in the widthwise direction orthogonal to the longitudinal direction and configured to mount the base portion; and
a narrow width portion between the connecting portion and the mount portion and having a length thereof in the widthwise direction orthogonal to the longitudinal direction that is smaller than the length of the connecting portion and the length of the mount portion,
wherein the connecting portion and the narrow width portion further include opposing side surfaces,
a distance between an opposing side surface of the connecting portion and an adjacent opposing side surface of the narrow width portion in the widthwise direction is NW, and
the opposing side surfaces of the connecting portion include a chamfered edge extending from the opposing side surface of the connecting portion along the longitudinal direction to a terminal point, and
a distance between the opposing side surfaces of the connecting portion and the terminal point in the widthwise direction is NC, and
NC is greater than or equal to one half of NW.

2. The piezoelectric vibrating piece of claim 1, wherein the chamfered corner has a beveled angle with respect to the longitudinal direction of one of 45° or 60°.

3. The piezoelectric vibrating piece of claim 1, wherein the chamfered corner has a beveled angle with respect to the longitudinal direction of 60°.

4. A piezoelectric vibrator comprising a package and the piezoelectric vibrating piece according to claim 1, wherein the piezoelectric vibrating piece is hermetically sealed in the package.

5. An oscillator comprising the piezoelectric vibrator according to claim 4 electrically connected to an integrated circuit that comprises an oscillator element.

6. An electronic device comprising the piezoelectric vibrator according to claim 4 electrically connected to a timer part.

7. A radio-controlled timepiece comprising the piezoelectric vibrator according to claim 4 electrically connected to a filter part.

8. A piezoelectric vibrating piece comprising:
a pair of vibrating arm portions parallel to each other and extending in a longitudinal direction and having proximal end sides; and
a base portion including:
a connecting portion having a length in a widthwise direction orthogonal to the longitudinal direction and having the proximal end sides of the vibrating arm portion fixed thereto;
a mount portion having a length in the widthwise direction orthogonal to the longitudinal direction and configured to mount the base portion; and
a narrow width portion between the connecting portion and the mount portion and having a length thereof in the widthwise direction orthogonal to the longitudinal direction that is smaller than the length of the connecting portion and the length of the mount portion,
wherein the opposing side surfaces of the narrow width portion include steps, such that at each step the length of the narrow width portion in the widthwise direction is progressively reduced along the longitudinal direction toward the narrow width portion.

9. A The piezoelectric vibrating piece comprising:
a pair of vibrating arm portions parallel to each other and extending in a longitudinal direction and having proximal end sides; and
a base portion including:
a connecting portion having a length in a widthwise direction orthogonal to the longitudinal direction and having the proximal end sides of the vibrating arm portion fixed thereto;
a mount portion having a length in the widthwise direction orthogonal to the longitudinal direction and configured to mount the base portion; and
a narrow width portion between the connecting portion and the mount portion and having a length thereof in the widthwise direction orthogonal to the longitudinal direction that is smaller than the length of the connecting portion and the length of the mount portion,
wherein opposing side surfaces of the narrow width portion include arcuate concave corner portions.

* * * * *

UNITED STATES PATENT AND TRADEMARK OFFICE
CERTIFICATE OF CORRECTION

PATENT NO. : 8,994,253 B2  
APPLICATION NO. : 13/759235  
DATED : March 31, 2015  
INVENTOR(S) : Daishi Arimatsu Page 1 of 1

It is certified that error appears in the above-identified patent and that said Letters Patent is hereby corrected as shown below:

In the Claims

In column 18, claim 9, line 9, before "piezoelectric vibrating" delete "The".

Signed and Sealed this  
Twenty-third Day of February, 2016

Michelle K. Lee  
*Director of the United States Patent and Trademark Office*